Aug. 8, 1961 E. W. OSBORN ET AL 2,995,719
TUNING DEVICE
Filed July 23, 1957

Inventors
Elmer W. Osborn
Frank A. Wood
By John J. Pederson
Attorney

United States Patent Office 2,995,719
Patented Aug. 8, 1961

2,995,719

TUNING DEVICE

Elmer W. Osborn, Chicago, and Frank A. Wood, Elmhurst, Ill., assignors to Zenith Radio Corporation, a corporation of Delaware Filed July 23, 1957, Ser. No. 673,639
1 Claim. (Cl. 336—136)

This invention relates in general to tuning apparatus and in particular to an improved tuning device.

The tuning apparatus adverted to above and the type this invention contemplates concerns tuning devices which utilize the variation of the inductance of a coil to accomplish tuning operations. A conventional method for varying the inductance of a coil provides for coaxial insertion of a ferromagnetic bar through the winding. Subsequently, when it was determined that accurate increments of inductance variation were desirable, it was proposed that the inner surface of an apertured coil mounting member be internally threaded and that the tuning core be externally relieved to engage the threaded inner surface of the coil form. However it was noted that even with the use of accurately machined components the tuning core tended to become axially displaced due to vibrations. A biasing or restraining element, e.g. an external spring, was thus required in order to preclude axial displacement of the core.

It was thereafter proposed that an expedient to obviate core travel be incorporated within the core support and thus dispense with the external biasing agent. Accordingly, a substantially cylindrical insert comprised of cosmolite, or a similarly impressionable material, was provided with an internal pilot thread, then crimped and inserted into a close-fitting apertured coil form. As the tuning core was advanced, guided by the pilot thread, it tended to displace the crimped portions thus creating a biasing force which prevented undesired axial displacement of the core after it had been selectively positioned. A problem of notable significance concerned the tendency of the cosmolite's threaded surface to disintegrate under repeated tuning operations. This type insert provides a satisfactory expedient where an inductance coil is tuned but rather infrequently, however, where recurrent tuning operations are required, e.g. the horizontal hold control of a television receiver, or any tuning operation in which an optimizing operation is frequently utilized, the aforementioned device is grossly inadequate.

Other considerations of significance concern economic shortcomings inherent to both of the above-mentioned tuning devices. For example, the core supporting insert requires a separate operation to acquire its pilot thread. Furthermore, the tuning core must, at some phase of the assembly process, be introduced to the insert and advanced to an approximate desired position. These characteristics of the prior art devices are time-consuming and thus costly.

It is therefore a principal object of this invention to provide an insertable tuning core mount characterized by an extended operating life.

It is also an object of this invention to provide a tuning core support bushing which permits, during the assembly process, instant positioning of the tuning element to its proximate operating location.

It is a further object of this invention to provide an insertable tuning core bushing which is easily and quickly installed within a coil form.

It is a further object of this invention to provide a tuning core support bushing amenable to simplified manufacturing techniques thereby enhancing its economical advantages.

In accordance with the invention a support bushing for a tuning core comprises an elongated unitary resilient member of thermoplastic material having matingly hinged multi-sided half-shell portions confronting each other to define a recess of polygonal cross-section with its wall segments oppositely disposed. This member is provided with an ordered array of integral shoulders which project inwardly from opposing pairs of the wall segments. An abutment integral with this elongated member is disposed laterally across the recess and near one end of the member. Finally, an externally threaded tuning slug is disposed within the recess and is threadingly engaged with the array of shoulders.

The features of the present invention which are believed to be novel are set forth with particularity in the appended claim. The organization and manner of operation of the invention, together with further objects and advantages thereof, may best be understood by reference to the following description taken in connection with the accompanying drawings, in the several figures of which like reference numerals identify like elements and in which:

Figures 1, 2, 3, 4, 5:
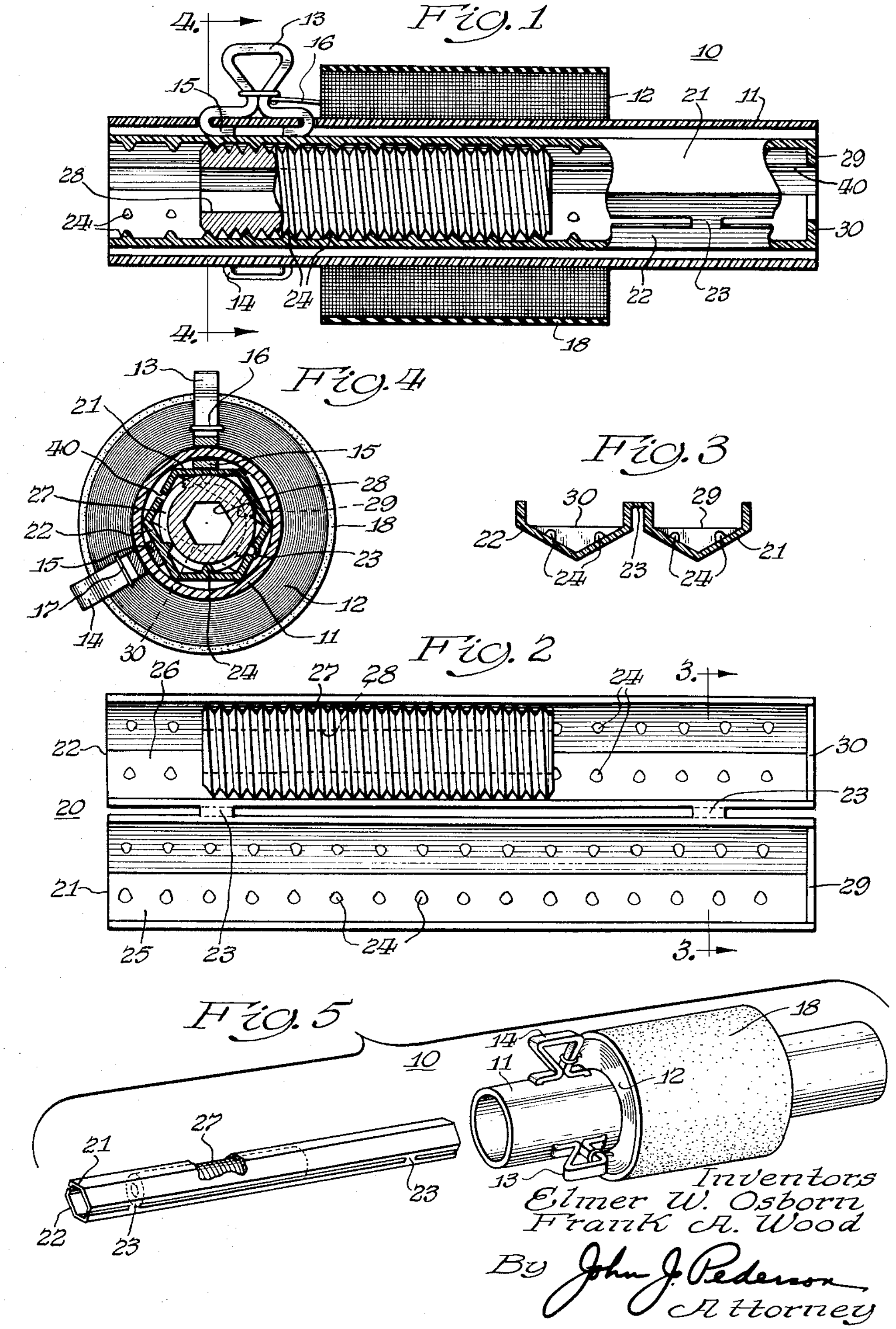
FIGURE 1 is a fragmentary elevation view, partly in section, illustrating the assembled tuning device.
FIGURE 2 is a plan view of the insertable bushing in which the bushing is shown in an extended position with a tuning core in place.
FIGURE 3 is a cross sectional view along line 3—3 of FIGURE 2.
FIGURE 4 is a cross sectional view taken along the line 4—4 of FIGURE 1 showing the insertable bushing and the tuning core mounted within the tuning device.
FIGURE 5 is an exploded perspective view depicting the cooperative association of the components of the subject tuning device.

The tuning device 10 as shown in FIGURE 1 comprises the apertured coil mounting member 11 having an inductive winding 12 disposed thereupon. A pair of terminals 13, 14 can be stapled to member 11, as shown, or by other suitable means to provide the folded-back end portions 15. Lead terminations 16, 17 of winding 12 can be soldered in a conventional manner to terminals 13, 14, respectively. A piece of vinyl tape 18 or other suitable protective insulating material is circumferentially disposed about winding 12.

An insertable bushing 20 which can be comprised of nylon or other resilient thermoplastic material, is disposed within coil form 11 as shown in FIGURE 1 and is detailed in FIGURE 2. With reference to FIGURE 2, bushing 20 is seen to comprise a pair of integral V-shaped segments 21, 22, resiliently joined by the hinges 23. A plurality of projections 24 are disposed in an ordered array upon respective inner surfaces 25, 26 of segments 21, 22. A bushing of this type including projections 24 and hinges 23 is easily molded in the flat, as shown in FIGURES 2 and 3, in one operation. A tuning core 27 having an axial drive slot 28 is shown rotatably seated upon projections 24 positioned within bushing 20.

FIGURE 3 comprises a sectional view through one of the hinges 23 and clearly illustrates the integrated construction of the segments 21, 22 and the hinge 23. Segments 21, 22 are further provided with respective stops 29, 30 to limit the inward progression of core 27.

FIGURE 4 depicts insert bushing 20 and core 27 positioned within coil form 11 and clearly shows a gap 40 defined by folded segments 21, 22 and further illustrates the manner in which end portions 15 of terminals 13 and 14 engage the outer surfaces of segments 22, 21, respectively, to frictionally secure bushing 20. Judicious dimensioning of insert 20, coil form 11 and the end portions 15 of terminals 13, 14 provides such retention, further, this construction enables bushing 20 and its core 27 to be readily demountable. A simple expedient, e.g.

bonding cement, can be resorted to in order to secure bushing 20 within coil form 11 permanently.

FIGURE 5 presents an exploded view of the tuning device showing insertable bushing 20 encapsulating the core 27 prior to the introduction of bushing 20 into coil form 11.

It is noteworthy to point up the simplified assembly features of tuning device 10 as well as its operative characteristics. As described above, bushing 20 is normally disposed in the extended position shown in FIGURE 2 prior to assembly. Since the approximate position of tuning core 27 is generally known for a particular tuning device, core 27 can be instantly positioned upon projections 24 to its proximate desired position. Segment 21 is then folded over segment 22 to encapsulate core 27 and thereafter introduced into coil form 11. The inherent resiliency of bushing 20 in conjunction with end portions 15 thereby permits a snug friction fit within coil form 11. However, it should be noted that elements such as the end portions 15 of terminals 13, 14 are not specifically required to insure a snug fit since, in any case, the resilient hinging of bushing 20 permits its girth to expand in response to the insertion of core 27 thus securely retaining bushing 20. Furthermore, the deformation of the sidewalls of segments 21, 22 by the encapsulation of core 27 produces a biasing action which constrains core 27 and obviates undesired displacement thereof due to vibration, jarring or other force.

With the tuning device now assuming the assembled form shown in FIGURE 1, a final or optimizing operation is performed. A conventional tuning wand (not shown) can be inserted into slot 28 to selectively position core 27 within coil form 11 thereby adjusting the inductance of winding 12 to a predetermined value.

Accordingly, a tuning device 10 utilizing a thermoplastic bushing 20 in pursuance of the inventive teaching provides a tuning device characterized by an extended operating life and one in which instant positioning of the tuning core to its proximate operating position is permitted. Since bushing 20 is amenable to simplified thermoplastic moulding techniques, bushing 20 including core supporting projections 24 can be moulded as a finished product requiring no further operations. Tuning assembly 10 thus comprises a novel and useful tuning arrangement which obviates the limitations and consequences of the prior art.

While a particular embodiment of the present invention has been shown and described, it will be obvious to those skilled in the art that changes and modifications may be made without departing from the invention in its broader aspects. Accordingly, the aim in the appended claim is to cover all such changes and modifications as fall within the true spirit and scope of the invention.

We claim:

In combination: an elongated unitary resilient member of thermoplastic material and having matingly hinged multi-sided half-shell portions confronted to define a recess of polygonal cross-section with its wall segments oppositely disposed, said member having an ordered array of integral shoulders projecting inwardly from respective opposing pairs of said wall segments together with an abutment integral with said member and disposed laterally across said recess near one end thereof; and an externally threaded tuning slug disposed within said recess and threadingly engaged with said shoulders.

References Cited in the file of this patent

UNITED STATES PATENTS

| | | |
|---|---|---|
| 2,204,086 | Kamenarovic | June 11, 1940 |
| 2,507,488 | Buffington | May 16, 1950 |
| 2,678,413 | Adler | May 11, 1954 |

FOREIGN PATENTS

| | | |
|---|---|---|
| 156,354 | Australia | May 5, 1954 |